(12) United States Patent
Wichern

(10) Patent No.: US 6,198,359 B1
(45) Date of Patent: Mar. 6, 2001

(54) OSCILLATOR WITH CROSS-COUPLING BY DIODES

(75) Inventor: Andreas Wichern, Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/359,267

(22) Filed: Jul. 22, 1999

(30) Foreign Application Priority Data

Jul. 23, 1998 (DE) ................................. 198 33 072

(51) Int. Cl.[7] ....................................................... H03B 5/12
(52) U.S. Cl. ................................. 331/117 R; 331/36 C; 331/175; 331/177 V
(58) Field of Search ..................... 331/36 C, 96, 331/116 R, 116 FE, 117 R, 117 FE, 117 D, 175, 177 V

(56) References Cited

U.S. PATENT DOCUMENTS

| 3,729,675 | * | 4/1973 | Vosteen | 324/72 |
|---|---|---|---|---|
| 3,836,831 | * | 9/1974 | Van Heelsbergen | 318/7 |
| 4,063,193 | * | 12/1977 | Wilcox | 331/117 R |
| 4,135,062 | * | 1/1979 | Ferrien | 179/84 R |
| 5,914,621 | * | 6/1999 | Coy | 327/134 |

FOREIGN PATENT DOCUMENTS

0746092A1   12/1996   (EP) .

* cited by examiner

*Primary Examiner*—David Mis
(74) *Attorney, Agent, or Firm*—Brian J. Wieghaus

(57) ABSTRACT

An oscillator arrangement is described including a resonant circuit having two poles from which an oscillation generated in the oscillator arrangement can be taken and including a differential amplifier of two emitter-coupled transistors having two collector electrodes of which each one is connected to one of the poles of the resonant circuit, and having two base electrodes cross-coupled to the poles of the resonant circuit. Such an oscillator arrangement can be constructed so as to generate a low-noise oscillation by means of a minimal number of circuit elements in that the base electrodes are each coupled to the poles of the resonant circuit via a diode configuration.

8 Claims, 1 Drawing Sheet

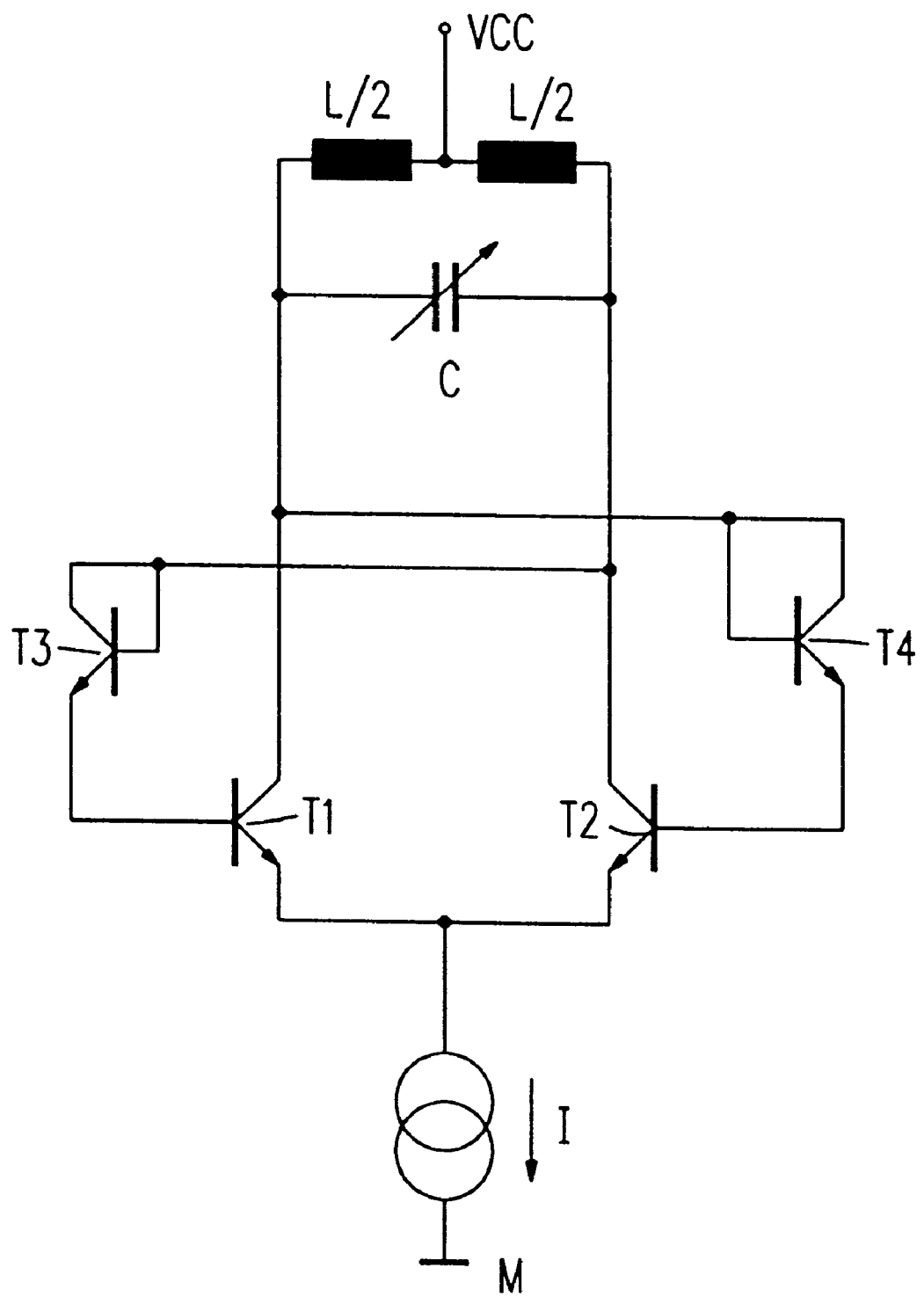

OSCILLATOR WITH CROSS-COUPLING BY DIODES

BACKGROUND OF THE INVENTION

The invention relates to an oscillator arrangement including a resonant circuit having two poles via which an oscillation generated in the oscillator arrangement can be extracted and including a differential amplifier formed by two emitter-coupled transistors having two collector electrodes of which each one is connected to one of the poles of the resonant circuit, and having two base electrodes cross-coupled to the poles of the resonant circuit.

In the circuit technology for the processing of high-frequency electromagnetic waves it is common practice to use voltage-controlled oscillators, particularly in phase-locked loops. For the integration of such oscillators on a semiconductor it is preferred to use circuits which operate in a push-pull or differential mode in order to minimize the current loop with as regards the frequency-determining resonant circuit because extremely large reactive currents flow in this current loop. This is independent of the fact whether the current loop is disposed within the semiconductor body or whether parts of the resonant circuit are situated outside the semiconductor body. Moreover, a current loop which is as small as possible, i.e. a conductor arrangement which is as compact as possible, in which said reactive currents enclose a minimal area, reduces the radiation of high-frequency power and, conversely, reduces the susceptibility of the oscillator arrangement to external interference. Such electromagnetic interference primarily arises owing to electromagnetic fields or via the power lines and manifests itself as common-mode interference. Furthermore, such a construction of the oscillator arrangement provides a satisfactory value for the signal to phase-noise ratio, because the signal amplitudes are added to one another arithmetically across the elements of the differential amplifier, while the noise is summed quadratically.

In a simple form the oscillator arrangement of the type defined in the opening paragraph basically comprises an emitter-coupled differential amplifier having cross-coupled base and collector electrodes. The collector electrodes are interconnected via the resonant circuit, while the base electrodes are connected to the collector electrodes of the respective other amplifying element of the differential amplifier. As a result of this cross-coupling a positive feedback is obtained, which reduces the damping of the resonant circuit to such an extent that oscillations are produced. One of the elements of the differential amplifier is then alternately conductive. Owing to the correspondingly strong excitation the amplitude of the voltage across the elements of the differential amplifier can become so large that these elements become saturated. However, upon saturation the oscillation amplitude is limited abruptly via the resonant circuit. This leads to a high harmonic content of the oscillation produced by the oscillator arrangement. Moreover, as a result of mixing processes which then occur, low-frequency noise components may be modulated onto the oscillation thus produced and thereby deteriorate the signal to phase-noise ratio.

From EP 0 746 092 A1 an oscillator arrangement of the type defined in the opening paragraph is known, by means of which it can be attempted to circumvent the aforementioned drawbacks. The oscillator described in said document comprises a differential amplifier stage which includes two transistors having their emitter electrodes both connected to ground via a current source. The transistors have their collector electrodes connected to a supply voltage terminal via a collector resistor each. Each of the collector electrodes of the transistors is connected to the base electrode of an emitter follower transistor, which emitter follower transistors have their collector electrodes coupled to the supply voltage terminal and which have their emitter electrodes connected to output terminals on which the oscillation generated in the oscillator arrangement is available. Each of the emitter follower transistors has its emitter electrode connected to the base electrode of one of the transistors of the differential amplifier stage, in such a manner that via each of the emitter follower transistors the collector electrode of one of the transistors is coupled to the base electrode of the respective other transistor of the differential amplifier stage. In this way positive feedback is obtained. The frequency-determining elements are connected between the collector electrodes of the transistors of the differential amplifier stage. In order to power the emitter follower transistors their emitter electrodes are connected to current sources which operate with respect to ground.

In this oscillator arrangement known from EP 0 746 092 A1 the collector-base potential of the transistors of the differential amplifier stage is larger than in the oscillator arrangement without the emitter follower transistors and the collector potential of the emitter follower transistors cannot become smaller than the supply voltage. However, in said oscillator arrangement the onset of saturation of the emitter follower transistor of the differential amplifier stage, or of the respective transistor of the differential amplifier stage which is turned on, causes the amplitude of the generated oscillation to be limited because the base potential of the transistors of the differential amplifier stage can still rise noticeably above the value of the supply voltage and also the base potential of the emitter follower transistors can rise far above the value of the supply voltage. Moreover, the use of the emitter follower transistors and their direct current supply leads to further low-frequency noise components, which cause a further modulation of the generated wave and thereby deteriorate the signal to phase-noise ratio.

SUMMARY OF THE INVENTION

It is an object of the invention to design an oscillator arrangement of the type defined in the opening paragraph with a minimal number of circuit elements, in such a manner that a low-noise oscillation is generated.

According to the invention this object is achieved with an oscillator arrangement of the type defined in the opening paragraph, in that the base electrodes are each coupled to the poles of the resonant circuit via a diode configuration.

The diode configurations used in accordance with the invention have the advantage that no additional elements, particularly current source circuits are required for biasing. Since such elements generally form additional noise sources it is possible to reduce the noise in the oscillator arrangement in accordance with the invention and thus, in particular, improve the signal to phase noise ratio. Moreover, the described saturation effect does not occur in the case of the diode configurations used in accordance with the invention. The resulting harmonic interference, i.e. an harmonic content which increases strongly with the saturation, is consequently avoided. On the contrary, the amplitude of the generated wave is determined exclusively by the decrease of the gain and, consequently, the positive feedback in the oscillator arrangement as the push-pull drive (differential drive) of the emitter-coupled transistors of the differential amplifier increase, as a result of which an oscillation is generated which is a symmetrical sinewave having a very low harmonic content. Moreover, the phase noise is also reduced as a result of the consequently decreased mixing processes.

In an advantageous embodiment of the oscillator arrangement in accordance with the invention the diode configurations include at least one base-collector coupled transistor. A transistor thus connected as a diode forms a diode configuration which is very advantageous for inclusion in the oscillator arrangement in accordance with the invention in view of its simple circuit design and its operating parameters. If required, each of the diode configurations may also comprise a series arrangement of a plurality of transistors connected as diodes by base-collector coupling. This makes it possible to select the desired potential difference in the base electrodes of the emitter-coupled transistors of the differential amplifier, which are coupled to the coupling branches of the differential amplifier, i.e. which are cross-coupled to the poles of the resonant circuit.

The invention can be used preferentially for realizing oscillator arrangements for phase-locked loops, preferably for the generation of constant-phase oscillations having a low harmonic content. Such oscillator arrangements and phase-locked loops including these arrangements are used in all fields of electrical communication technology. A preferred field of use is in radio, audio and/or television signal processing circuits and in the equipment in which these circuits are used. A further preferred field of use is in navigation systems, for example GPS systems.

BRIEF DESCRIPTION OF THE DRAWINGS

An embodiment of the invention, given by way of example, will now be described in more detail with reference to the drawing.

The oscillator arrangement in accordance with the invention shown in the sole FIGURE includes a differential amplifier comprising two emitter-coupled transistors T1 and T2.

DESCRIPTION OF THE PREFERRED EMBODIMENTS

A direct current source, which carries a current I, is arranged between the node coupling the emitter electrodes of the transistors T1, T2 and ground M. The collector electrodes of the transistors T1 and T2 of the differential amplifier are connected to a positive terminal of a supply voltage source via a split inductance L/2 each, which terminal carries a d.c. supply voltage VCC which is positive with respect to ground M. The nodes between the split inductances L/2 and the collector electrodes of the transistors T1, T2 form poles of a resonant circuit which, apart from the split inductances L/2, comprises a variable capacitance C whose electrodes are each connected to one of the poles of the resonant circuit. In the resonant circuit the split inductances L/2 are arranged in series and form together the inductance L of the resonant circuit. For alternating current this resonant circuit forms a rejection circuit which couples the collector electrodes of the transistors T1, T2 of the differential amplifier.

The base electrodes of the transistors T1, T2 of the differential amplifier are cross-coupled to the collector electrodes of the transistors T1, T2, i.e. to the poles of the resonant circuit. This coupling is made via diode-connected transistors having their collector and base electrodes interconnected. A first transistor T3 of these diode-connected transistors connects the base electrode of the transistor T1 of the differential amplifier to the collector electrode of the transistor T2. Likewise, a second transistor T4 of these diode-connected transistors connects the base electrode of the transistor T2 of the differential amplifier to the collector electrode of the transistor T1.

In the embodiment of the invention shown in the FIGURE the cross-coupling, in the same way as in a simple oscillator arrangement, which employs simple electrical connections instead of diode-connected transistors T3, T4, also produces positive feedback, which reduces the damping of the resonant circuit L/2, C to such an extent that an oscillation is generated. In order to explain the operation of this simple oscillator arrangement it is assumed that the transistor T1 of the differential amplifier is in the cut-off state at a given instant. Its base electrode is then at a low electric potential. However, at the same time the electric potential at the collector electrode of the transistor T1 rises above the value VCC of the d.c. supply voltage. Depending on the quality factor of the resonant circuit or, in general, of the oscillator arrangement the amplitude of the wave produced across resonant circuit, i.e. the potential at the collector electrode of the transistor T1, can assume a very high value. At the same instant the transistor T2 of the differential amplifier is in its conductive state because the electric potential at its collector electrode assumes a low value below the d.c. supply voltage VCC, corresponding to the oscillation appearing on the poles of the resonant circuit, but at the same time the electric potential at the base electrode of the transistor T2 corresponds to the potential at the collector electrode of the transistor T1 and consequently assumes a very high value. In this operating condition the electric potential at the base electrode of the transistor T2 is consequently more positive than that at the collector electrode. As a result of this, the collector-base diode of the transistor T2 changes from its normally cut-off state to the conductive state. As a consequence, the transistor T2 is driven into saturation. As a result of this, the amplitude of the oscillation generated by the oscillator arrangement at the poles of the resonant circuit is limited abruptly, the crests of the sinewave oscillation then being clipped. This leads to a high harmonic content of the generated oscillation. Moreover, low-frequency noise components are produced as a result of mixing processes which then occur, which noise components are modulated onto the generated oscillation and thereby cause the signal to phase-noise ratio to deteriorate.

In accordance with the invention this effect can be remedied by means of the cross-coupling via the diode-connected transistors T3, T4. In order to explain this, the operating condition is considered again in which the transistor T1 is cut off and the transistor T2 is conductive. The electric potential at the collector electrode of the transistor T1 in this condition is higher than the electric potential at the collector electrode of the transistor T2. The potential at the base electrode of the transistor T2, however, does not directly follow the potential at the collector electrode of the transistor T1 but is reduced by one forward diode voltage of the base-emitter diode of the transistor T4. As a result of this, if the amplitude of the oscillation generated at the poles of the resonant circuit L, C has not changed, the transistors T1, T2 of the differential amplifier are not driven to the same extent as in the absence of the transistors T3, T4. Thus, saturation of the transistors T1, T2 of the differential amplifier will occur only with a delay. Moreover, it can be influenced in that instead of a single diode-connected transistor configuration a plurality of such transistor configurations are arranged in parallel.

Thus, in the present arrangement the amplitude of the oscillation generated by the oscillator arrangement is determined exclusively by the decrease of the gain and, consequently, of the positive feedback of the differential amplifier when the differential drive of the transistors T1, T2 increases. As a result of this, the generated oscillation is a symmetrical sinewave signal having a very low harmonic content, i.e. a very low non-linear distortion factor. Moreover, mixing processes are also reduced, so that the signal to phase-noise ratio of the oscillator arrangement can improve.

Furthermore, no saturation effect is to be expected from the diode-connected transistors T3, T4 because the electric potentials at the collector electrodes of these transistors directly follow the potentials at the base electrodes. As a result of this, the base-collector diodes of these transistors T3, T4 cannot become conductive.

The variable capacitance C, which is shown symbolically in the drawing, can be implemented, in a manner known per se, as a configuration of fixed capacitances and varactor diodes by means of which the resonant frequency of the oscillator arrangement can be adjusted externally with the aid of a control voltage. Such a configuration comprises, for example, a parallel arrangement of a fixed capacitance with a series arrangement of two varactor diodes across, via whose interconnection node the control voltage is applied.

Thus, the invention provides a very simple oscillator arrangement by means of which oscillations with a low harmonic content and a low level of phase noise can be generated. The use of additional bias circuits can be avoided, as a result of which it is possible not only to avoid additional circuit elements but also undesired additional noise sources. By means of modern processes for the fabrication of integrated semiconductor circuits which also enable the integration of high-quality inductances, the oscillator arrangement in accordance with the invention can be accommodated completely on a semiconductor body, including all the inductances, capacitances and varactor diodes. Moreover, in a variant the inductances can be formed by capacitive circuit elements by means of gyrator circuits, which provides a greater choice of circuit techniques and fabrication processes.

Although the above exemplary embodiment includes only bipolar transistors of the NPN type, an oscillator arrangement in accordance with the invention can be implemented likewise by means of bipolar transistors of the PNP type or by means of field-effect transistors. Instead of the diode-connected transistors T3, T4 it is possible to use Schottky diodes, which then constitute the diode configurations via which the cross-coupling is made. It is obvious that the embodiment of an oscillator arrangement given by way of example also covers an arrangement of the inductance L or the split inductances L/2 outside a semiconductor body which incorporates the other elements of the oscillator arrangement. Moreover, these inductances may also be constructed as microstrip lines or similar high-frequency or microwave lines or arrangements for the generation of very high frequencies.

What is claimed is:

1. An oscillator arrangement including:
   a resonant circuit having two poles via which an oscillation generated in the oscillator can be extracted, and
   a differential amplifier formed by two emitter-coupled transistors having
      two collector electrodes of which
         each one is connected to one of the poles of the resonant circuit, and
      two base electrodes cross-coupled to the poles of the resonant circuit only, characterized in that
      the base electrodes are each coupled to the poles of the resonant circuit via a diode configuration.

2. The oscillator arrangement as claimed in claim 1, characterized in that the diode configurations each comprise at least one base-collector coupled transistor.

3. The oscillator arrangement as claimed in claim 1, characterized in that the diode configurations each comprise a series arrangement that includes at least one base-collector coupled transistor.

4. The oscillator arrangement as claimed in claim 1, wherein the resonant circuit includes:
   a capacitor having two electrodes, each of which are coupled to one of the poles of the resonant circuit, and
   a pair of inductors,
      each inductor of the pair of inductors having
         a first electrode that is coupled to one of the poles of the resonant circuit, and
         a second electrode that is coupled to a common supply voltage.

5. An oscillator circuit comprising:
   a first supply voltage terminal and a second supply voltage terminal,
   a resonant circuit, operably coupled to the first supply voltage terminal, and having a first pole and a second pole,
   a current supply, operably coupled to the second supply voltage terminal, and having a current supply node,
   a first transistor and a second transistor, each transistor having a first terminal, a second terminal, and a third terminal,
      the first terminal of the first transistor being coupled to the first pole,
      the first terminal of the second transistor being coupled to the second pole,
      the second terminal of the first transistor being coupled to the current supply node,
      the second terminal of the second transistor being coupled to the current supply node,
      the third terminal of the first transistor being coupled to the second pole only, via a first diode configuration,
      the third terminal of the second transistor being coupled to the first pole only, via a second diode configuration.

6. The oscillator circuit of claim 5, wherein
   the resonant circuit includes:
      a capacitor having
         a first electrode that is coupled to the first pole, and
         a second electrode that is coupled to the second pole,
      a first inductor having
         a first electrode that is coupled to the first supply terminal, and
         a second electrode that is coupled to the first pole, and
      a second inductor having
         a first electrode that is coupled to the first supply terminal, and
         a second electrode that is coupled to the second pole.

7. The oscillator circuit of claim 5, wherein the first and second diode configurations each comprise at least one base-collector coupled transistor.

8. The oscillator circuit of claim 5, wherein the first and second diode configurations each comprise a series arrangement that includes at least one base-collector coupled transistor.

* * * * *